(12) United States Patent  (10) Patent No.: US 7,975,901 B2
Maeda et al.  (45) Date of Patent: Jul. 12, 2011

(54) BONDING APPARATUS AND WIRE BONDING METHOD

(75) Inventors: Toru Maeda, Tokyo (JP); Tetsuya Utano, Tokyo (JP); Akinobu Teramoto, Miyagi (JP)

(73) Assignees: Shinkawa Ltd., Tokyo (JP); Tohoku University, Miyagi (JP)

( * ) Notice: Subject to any disclaimer, the term of this patent is extended or adjusted under 35 U.S.C. 154(b) by 0 days.

(21) Appl. No.: 12/794,911

(22) Filed: Jun. 7, 2010

(65) Prior Publication Data

US 2010/0294435 A1 Nov. 25, 2010

Related U.S. Application Data

(63) Continuation of application No. PCT/JP2008/068248, filed on Oct. 7, 2008.

(30) Foreign Application Priority Data

Dec. 7, 2007 (JP) ................................ 2007-317518

(51) Int. Cl.
  *B23K 31/02* (2006.01)
  *B23K 37/00* (2006.01)
  *C23F 1/00* (2006.01)
(52) U.S. Cl. ........ 228/180.5; 228/4.5; 228/201; 134/1.2
(58) Field of Classification Search .................. None
  See application file for complete search history.

(56) References Cited

U.S. PATENT DOCUMENTS

| 5,433,371 | A | 7/1995 | Morisako |
| 6,320,155 | B1* | 11/2001 | Barnett .................. 219/121.46 |
| 7,795,557 | B2* | 9/2010 | Brunner et al. ............ 219/56.22 |
| 2007/0000878 | A1 | 1/2007 | Fujita et al. |
| 2007/0001320 | A1 | 1/2007 | Maeda |
| 2008/0023028 | A1* | 1/2008 | Fujita .............................. 134/1.1 |
| 2008/0023525 | A1* | 1/2008 | Maeda et al. ................... 228/18 |

FOREIGN PATENT DOCUMENTS

| JP | 63-55946 | 3/1988 |
| JP | 02-112246 | 4/1990 |
| JP | 04-196333 | 7/1992 |
| JP | 06-132343 | 5/1994 |
| JP | 2001-68500 | 3/2001 |
| JP | 2006-332151 | 12/2006 |
| JP | 2006-332152 | 12/2006 |
| JP | 2007-12909 | 1/2007 |
| JP | 2007-12910 | 1/2007 |

* cited by examiner

*Primary Examiner* — Kiley Stoner
(74) *Attorney, Agent, or Firm* — Katten Muchin Rosenman LLP

(57) ABSTRACT

A bonding apparatus including a chamber for maintaining an inert gas atmosphere; a first plasma torch for performing a surface treatment on pads and electrodes, the first plasma torch being attached in the chamber, to apply gas plasma to a substrate and a semiconductor chip that is placed inside the chamber; a second plasma torch for performing a surface treatment on an initial ball and/or wire at a tip end of a capillary that is positioned inside the chamber, the second plasma torch being attached in the chamber, to apply gas plasma to the initial ball and/or wire; and a bonding unit for bonding the surface-treated initial ball and/or wire to the surface-treated pads and electrodes in the chamber, thereby cleaning of the surface of the electrodes and pads as well as the wire can be effectively performed.

13 Claims, 8 Drawing Sheets

BONDING APPARATUS AND WIRE BONDING METHOD

BACKGROUND OF THE INVENTION

1. Field of the Invention

The present invention relates to a structure of a bonding apparatus and to a bonding method using the bonding apparatus.

2. Description of the Related Art

In the case of ultrasonic or thermo-compressive bonding of thin metallic wires to pads on electrode sections in a semiconductor chip and electrodes on a circuit board using a wire bonding apparatus for connection therebetween, the surface state of the pads or electrodes is critical for the bonding quality. That is, if the metal-layer surfaces of the pads or electrodes are contaminated, or water or foreign material adheres thereto, there occur problems of poor electrical bonding between the pads or electrodes and the wires as well as of reduced mechanical bonding strength. It is, therefore, often the case that a surface treatment is performed before the bonding process to remove contamination, water, or foreign material on the pads or electrodes.

Such a surface treatment for removal of contamination, water, or foreign material on metal surfaces has conventionally been a wet cleaning process in which the metal surfaces are sprayed with a water removing solvent and an organic contamination removing solvent and then dried and electrically neutralized under an inert gas atmosphere. However, apparatuses for such wet cleaning are required to supply, discharge, and dispose cleaning liquid, suffering from a problem in that the overall apparatus size increases to be less easily incorporated into a wire bonding apparatus.

Hence, there has been proposed a dry cleaning method in which metal surfaces are irradiated with plasma to be cleaned without using any solvents. Japanese Unexamined Patent Application Publication No. 2006-332152, for example, proposes a metal surface cleaning method in which the surfaces of pads on a semiconductor chip are irradiated with argon gas plasma. Japanese Unexamined Patent Application Publication No. 2006-332152 also proposes a method for good bonding in which the spark voltage and/or current when forming wires into balls are regulated to increase the crystal grain size and the balls are softened to thereafter be pressed and bonded to the pads on the semiconductor chip. This method aims at good bonding by softening the balls to increase the deformation of the balls when pressed against the pads, so that shells which is formed by oxide films and/or substances that adheres on the surfaces of the balls when the balls are formed, are broken through the deformation to expose newly emerging metal surfaces, and pressing the newly emerging surfaces against cleaned pad surfaces.

Japanese Unexamined Patent Application Publication No. 2006-332151 proposes a method in which when a semiconductor chip is flip-chip mounted on a lead frame or a substrate, electrodes on the surface of the lead frame or substrate are irradiated with argon gas plasma to be cleaned, while the surfaces of stud bumps formed on electrodes on the semiconductor chip are exposed to laser radiation so that the stud bumps have an increased crystal grain size to be softened, and then the stud bumps are pressed against the electrodes. This method aims at good bonding by increasing the deformation of the stud bumps when pressed against the electrodes on the lead frame or substrate, so that shells which is formed by oxide films and/or substances that adheres on the surfaces of the stud bumps are broken through the deformation to expose newly emerging metal surfaces, and pressing the newly emerging surfaces against cleaned pad surfaces.

In addition, Japanese Unexamined Patent Application Publication No. 2001-68500 proposes a method of bonding wires to pads with lower load without using ultrasonic energy in which a wire extending from a tip end of a capillary is formed into a ball through a micro-arc process and the ball in a melt state is bonded directly to a pad, and also a method in which the metal surfaces of electrodes are irradiated with argon micro-plasma arc to be cleaned, and then wires are bonded to the electrodes.

The related arts disclosed in Japanese Unexamined Patent Application Publication Nos. 2006-332152 and 2006-332151 are directed to a method that aims at good bonding by softening the balls or stud bumps so that shells which is formed by oxide films and/or substances that adheres on the surfaces of the balls or stud bumps are broken when pressed against the electrode surfaces to allow newly emerging metal surfaces to come into contact with the electrode surfaces, and not to removal oxide films or substances that adheres on the surface thereof. Therefore, in the related arts disclosed in Japanese Unexamined Patent Application Publication Nos. 2006-332152 and 2006-332151, the oxide films and/or substances that adheres on the surfaces of the balls or stud bumps may be placed between the metal surfaces and the balls or stud bumps during bonding, resulting in poor bonding.

Also, in the related arts disclosed in Japanese Unexamined Patent Application Publication Nos. 2006-332152, 2006-332151, and 2001-68500, the surfaces of the pads on the semiconductor chip or the electrodes on the lead frame or substrate can be cleaned by irradiation of plasma thereto, but balls or wires to be bonded to the pads or electrodes cannot be cleaned, whereby substances that adheres on the surfaces of the balls or wires may cause poor bonding.

BRIEF SUMMARY OF THE INVENTION

It is an object of the present invention to effectively perform a surface treatment on bonding targets as well as initial balls and wires.

The present invention is directed to a bonding apparatus for bonding a wire inserted through a bonding tool to a bonding target, including: a chamber for maintaining an inert gas atmosphere; a first plasma torch for performing a surface treatment of the bonding target, the first plasma torch being attached in the chamber, to irradiate gas plasma to the bonding target that is placed inside the chamber; a second plasma torch for performing a surface treatment of one or both of an initial ball and a wire at a tip end of the bonding tool that is positioned inside the chamber, the second plasma torch being attached in the chamber, to irradiate gas plasma to one or both of the initial ball and the wire; and a bonding unit for bonding surface-treated one or both of the initial ball and the wire on the surface-treated bonding target in the chamber.

The bonding apparatus according to the present invention can preferably be arranged such that the chamber is mounted on a pedestal, and the bonding unit is configured to include a stage for moving the bonding target in a direction along the bonding surface thereof and a bonding head for moving the bonding tool in a direction toward and away from the bonding target. The bonding apparatus can also preferably be arranged such that the gas plasma is produced by turning a mixed gas of noble gas and hydrogen into plasma. The bonding apparatus can preferably further include a mixing nozzle for mixing hydrogen into plasma of noble gas.

The present invention is also directed to a method of bonding a wire inserted through a bonding tool to a bonding target, including: a first surface treatment step of performing a surface treatment of the bonding target to irradiate gas plasma to the bonding target that is placed inside a chamber, the chamber for maintaining an inert gas atmosphere, by a first plasma torch being attached in the chamber; a second surface treatment step of performing a surface treatment on one or both of an initial ball and a wire at a tip end of the bonding tool that is positioned inside the chamber to irradiate gas plasma to one or both of the initial ball and the wire, by a second plasma torch being attached in the chamber; and a bonding step of bonding surface-treated one or both of the initial ball and the wire to the surface-treated bonding target in the chamber. The bonding method according to the present invention can preferably be arranged such that a mixed gas of noble gas and hydrogen is turned into plasma. The bonding method can also preferably be arranged such that the first and second surface treatment steps include mixing hydrogen into plasma of noble gas and irradiating the plasma mixed with hydrogen to the bonding target and one or both of the initial ball and the wire.

The present invention offers the advantage that a surface treatment can be performed effectively on bonding targets as well as initial balls and wires.

BRIEF DESCRIPTION OF THE SEVERAL VIEWS OF THE DRAWINGS

Exemplary embodiments of the present invention will be described in detail based on the following figures, wherein.

DETAILED DESCRIPTION OF THE INVENTION

Figure 1:
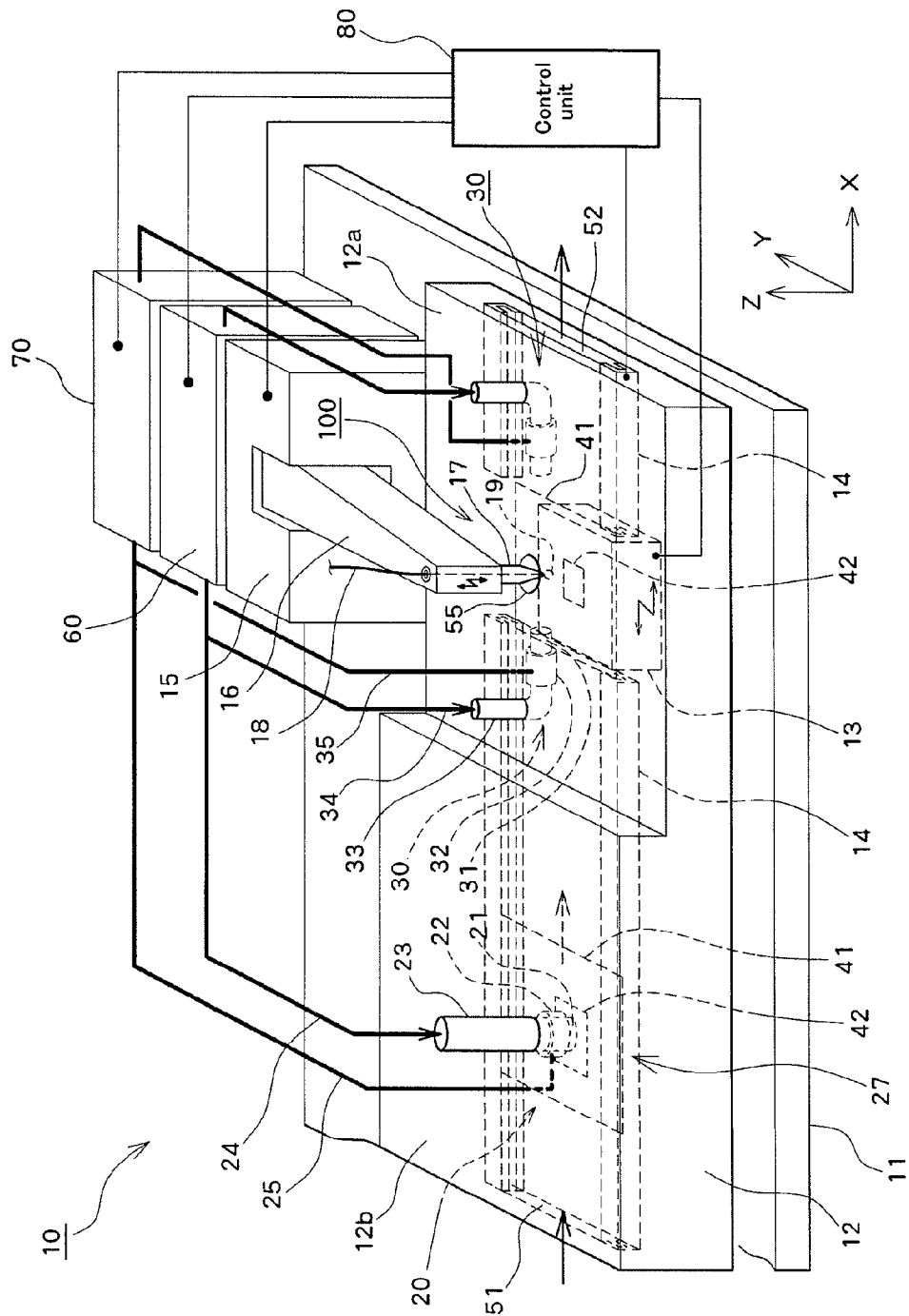
FIG. 1 is a perspective view illustrating the configuration of a bonding apparatus according to an exemplary embodiment of the present invention.

Exemplary embodiments of the present invention will hereinafter be described in detail with reference to the accompanying drawings. As shown in FIG. 1, a bonding apparatus 10 according to an exemplary embodiment includes a pedestal 11, a bonding stage 13 mounted on the pedestal 11, a carriage path 14 for carrying in the X direction shown in the figure, a substrate 41 serving as a bonding target with a semiconductor chip 42 being mounted on the surface thereof, a capillary 17 serving as a bonding tool, a bonding arm 16 to which the capillary 17 is attached, a bonding head 15 fixed to the pedestal 11 and for driving the bonding arm 16, a chamber 12 mounted on the pedestal 11 to cover the bonding stage 13 and the carriage path 14, a first plasma torch 20 attached to the chamber 12, two second plasma torches 30, a gas supply unit 60 for supplying gas for plasma generation to the plasma torches 20 and 30, a high-frequency power supply unit 70 for supplying high-frequency power for plasma generation to the plasma torches 20 and 30, a control unit 80 connected with the bonding head 15, gas supply unit 60, high-frequency power supply unit 70, carriage path 14, and bonding stage 13 to integrally control these components, and as shown in FIG. 2, a supply stack 53 for supplying a substrate 41 with a semiconductor chip 42 being mounted on the surface thereof to the carriage path 14, and a product stack 54 to be stocked with a substrate 41 after bonding through the bonding stage 13.

The bonding stage 13 includes vacuum contact holes in its bonding surface to fix the substrate 41 thereon, and the vacuum contact holes are to be vacuumed by a vacuum apparatus (not shown) so that the substrate 41 is brought into contact with and fixed to the bonding surface. Also, as shown in FIG. 1, the bonding stage 13 is configured to be moved by an XY-direction drive mechanism in the X and Y directions shown in the figure along the bonding surface of the substrate 41. The carriage path 14 supports the substrate 41 on either side in the carrying direction and is configured to carry the substrate 41 in the X direction shown in the figure from the supply stack 53 to the product stack 54 shown in FIG. 2, where as shown in FIG. 1, the substrate 41 is stopped at a cleaning point 27 halfway through the carriage path 14, then moved from the cleaning point 27 to the bonding stage 13, and then carried from the bonding stage 13 to the product stack 54.

The bonding head 15 includes a Z-direction motor for swingably driving the bonding arm 16 in the Z direction, in which the tip end of the bonding arm 16 is moved close to or away from the substrate 41 in fixed contact with the bonding stage 13. The capillary 17 serving as a bonding tool is attached to the end of the bonding arm 16 leading toward the bonding stage 13. The tip end side of the capillary 17 has a shape tapered toward the tip, while the base end side has a cylindrical shape attached to the bonding arm 16. The capillary 17 has a through hole at the center thereof, and a gold thin wire 18 is inserted through the through hole. An initial ball 19 is formed by, for example, a spark process at the tip end of the wire 18 extending from the tip end of the capillary 17. The bonding head 15, bonding arm 16, capillary 17, and bonding stage 13 constitute a bonding unit 100 for connecting the substrate 41 and the semiconductor chip 42 mounted on the substrate 41 with the wire 18.

Figure 2:
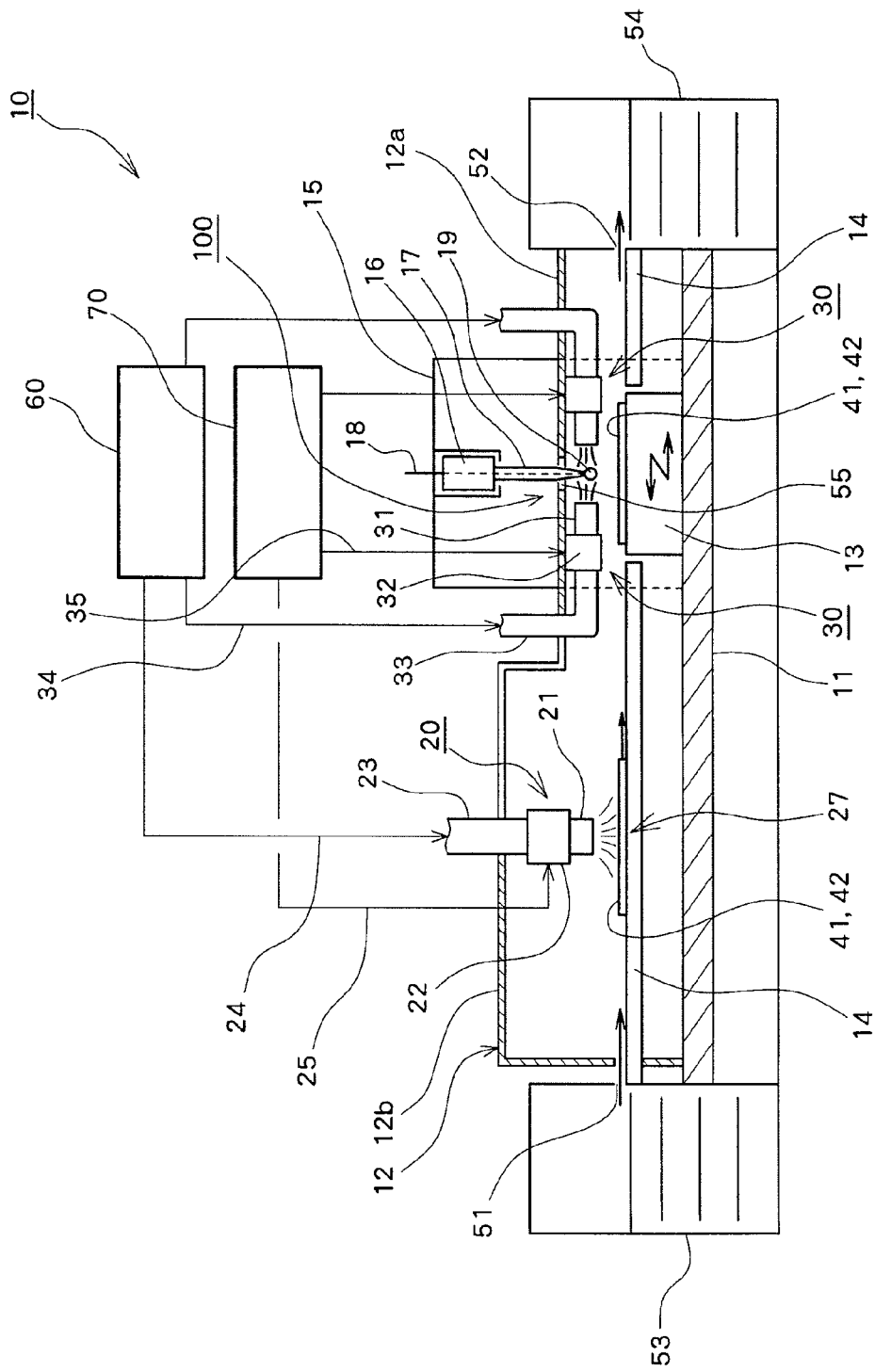
FIG. 2 is a cross-sectional view illustrating the configuration of the bonding apparatus according to an exemplary embodiment of the present invention.

As shown in FIGS. 1 and 2, the chamber 12 is mounted on the pedestal 11 and has a stepped box shape covering the bonding stage 13 and the carriage path 14. An inlet slot 51 is provided in a side plate of the chamber 12 for the entry of a substrate 41 to be supplied from the supply stack 53 to the carriage path 14 inside the chamber 12, while an outlet slot 52 is provided in a side plate for the exit of a product after bonding from the carriage path 14 inside the chamber 12 to the product stack 54. Also, one upper plate 12a of the chamber 12 covering over the bonding stage 13 is provided between the bonding stage 13 and the bonding arm 16, and is provided with a capillary hole 55 through which the capillary 17 attached to the bonding arm 16 passes. The other upper plate 12*b* covering over the cleaning point 27 on the upstream side of the bonding stage 13 in the carrying direction of the carriage path 14 is arranged stepwise with respect to the upper plate 12*a*.

As shown in FIGS. 1 and 2, a first plasma torch 20 is provided for applying gas plasma that is produced by turning gas supplied from the gas supply unit 60 into plasma, to the substrate 41 which is stopping at the cleaning point 27 and is attached to the upper plate 12*b* of the chamber 12 over the cleaning point 27 in such a manner as to be approximately perpendicular to the substrate 41, which is stopping at the cleaning point 27. The first plasma torch 20 includes a tip end portion 21 placed inside the chamber 12 and having an opening through which gas plasma blows, an external electrode 22 to which high-frequency power for gas plasma generation is supplied, and a gas feed pipe 23 through which gas plasma is fed. The gas feed pipe 23 protrudes out of the chamber 12 through the upper plate 12*b* and is connected to the gas supply unit 60 through a gas pipe 24 connected to the gas feed pipe 23. The external electrode 22 is connected to the high-frequency power supply unit 70 through an electrical cable 25 running through the upper plate 12*b*.

As shown in FIGS. 1 and 2, like the first plasma torch 20, two second plasma torches 30 are also provided for applying gas plasma that is produced by turning gas supplied from the gas supply unit 60 into plasma to the initial ball 19. Two second plasma torches 30 are attached to the upper plate 12*a* of the chamber 12 over the bonding stage 13 in such a manner as to face each other across the capillary hole 55. Inside the chamber 12, the second plasma torches 30 are in approximately parallel with the bonding surface of the bonding stage 13, and the tip end portion 31 through which gas plasma blows is attached in such a manner as to extend toward the initial ball 19 formed at the tip end of the capillary 17. Also, the second plasma torches 30 each include an external electrode 32 to which high-frequency power for gas plasma generation is supplied and a gas feed pipe 33 through which plasma gas is fed. The gas feed pipe 33 is bent inside the chamber 12 to protrude out of the chamber 12 through the upper plate 12*a* and is connected to the gas supply unit 60 through a gas pipe 34 connected to the gas feed pipe 33. The external electrode 32 is connected to the high-frequency power supply unit 70 through an electrical cable 35 running through the upper plate 12*a*.

An inert gas supply unit (not shown) is connected to supply inert gas to the chamber 12. The inert gas can be nitrogen, for example. The inert gas supplied to the chamber 12 flows out of the inlet slot 51, outlet slot 52, and capillary hole 55 to prevent outside air from entering the chamber 12 through these openings and thereby maintaining an inert gas atmosphere in the chamber 12. The inlet and outlet slots 51 and 52 can be covered to suppress outflow of the inert gas.

Figure 3:
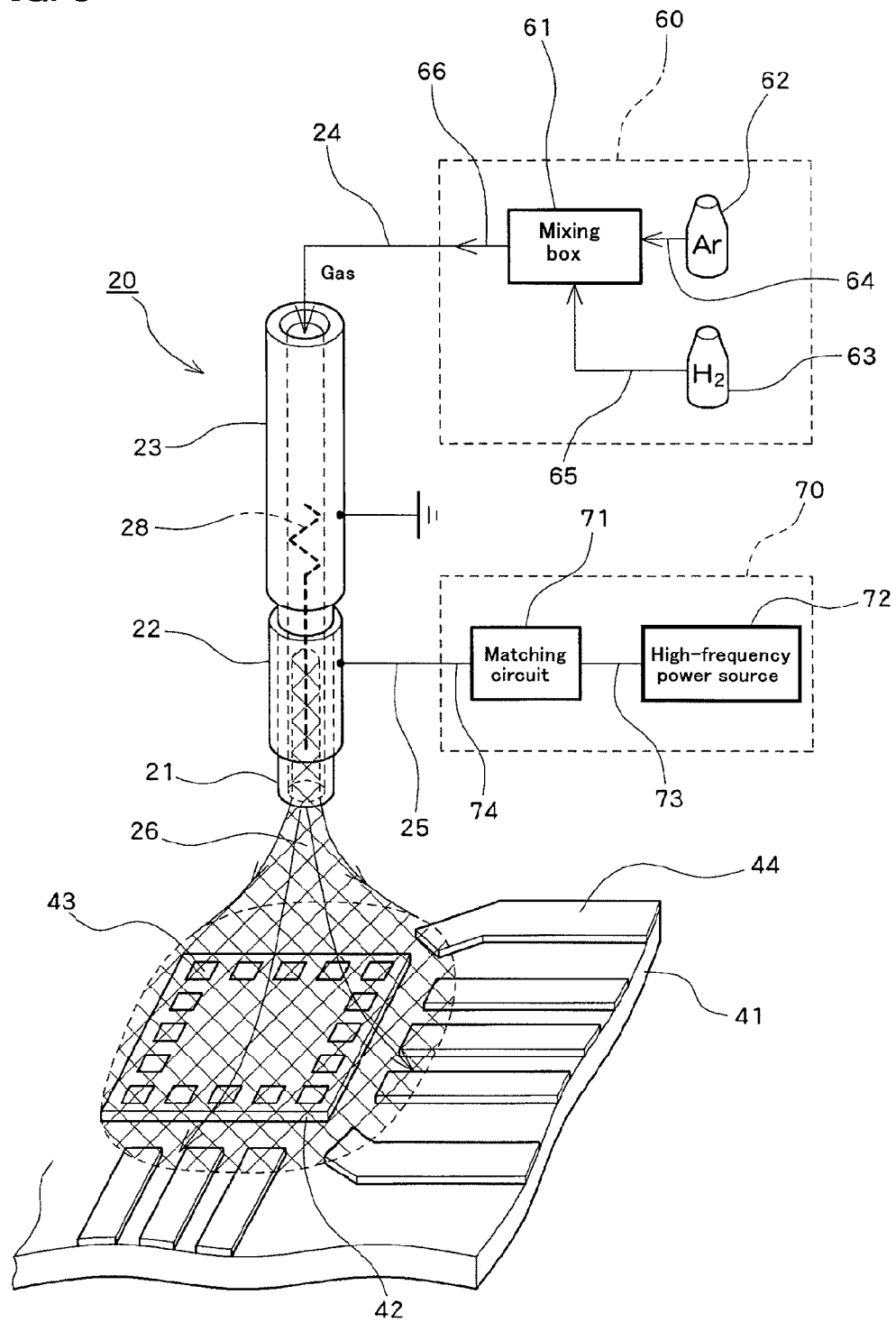
FIG. 3 is a perspective view illustrating the configuration of a first plasma torch and the application of gas plasma in the bonding apparatus according to an exemplary embodiment of the present invention.

As shown in FIG. 3, the first plasma torch 20 includes a cylindrical tip end portion 21 made of an insulating material and, at the tip end thereof, having an opening through which gas plasma blows, a cylindrical external electrode 22 provided outside of the tip end portion 21, a cylindrical gas feed pipe 23 made of an electrically-conductive material and connected to the tip end portion 21, and an internal electrode 28 provided inside of the gas feed pipe 23, one end thereof being in contact with the inner surface of the gas feed pipe 23 and the other end extending inside of the tip end portion 21. The gas feed pipe 23 and the internal electrode 28 are electrically grounded. The gas supply unit 60 has a feature of supplying gas serving as plasma source gas, specifically including a mixing box 61 for mixing reducing gas into noble gas, an argon gas canister 62 filled with argon gas serving as noble gas source, a hydrogen gas canister 63 filled with hydrogen gas for reduction treatment, connection pipes 64 and 65 for connection of the respective gas canisters 62 and 63 to the mixing box 61, and a gas supply pipe 66 for supplying gas for plasma generation therethrough. The gas supply pipe 66 is connected to the gas feed pipe 23 through the gas pipe 24. Although argon gas is used as noble gas in the description of the exemplary embodiment, nitrogen gas can be used, for example.

As shown in FIG. 3, the high-frequency power supply unit 70 is configured to supply high-frequency power for continuous plasma generation to the external electrode 22 of the first plasma torch 20, including a matching circuit 71 and a high-frequency power source 72. The matching circuit 71 is, for example, an LCR resonant circuit, used to suppress power reflection when high-frequency power is supplied to the external electrode 22. The high-frequency power source 72 can have a frequency range from 100 MHz to 500 MHz, for example. Power energy to be supplied is determined based on a variety and a flow rate of gas supplied from the gas supply unit 60 and the stability of plasma. The high-frequency power source 72 is controlled by the control unit 80. The high-frequency power source 72 is connected to the matching circuit 71 through a high-frequency power connection line 73. High-frequency power is then output from the matching circuit 71 through a high-frequency power output line 74 to the electrical cable 25.

As shown in FIG. 3, the first plasma torch 20 is configured to distribute high-frequency power between the internal electrode 28, grounded gas feed pipe 23, and external electrode 22 to turn gas fed through the gas feed pipe 23 into plasma and to apply the gas plasma from the opening at the tip end portion 21 to the substrate 41 and the semiconductor chip 42 mounted on the substrate 41. The cross-hatched area in FIG. 3 shows jet flow 26 of the gas plasma. As shown in FIG. 3, the jet flow 26 of the gas plasma spreads from the tip end portion 21 toward the substrate 41 and semiconductor chip 42 to cover pads 43 formed on the surface of the semiconductor chip 42 and bonding areas of electrodes 44 formed on the substrate 41. Consequently, the pads 43 on the semiconductor chip 42 and the electrodes 44 on the substrate 41 can be surface-treated simultaneously by stopping the substrate 41 at the cleaning point 27 and applying the gas plasma from the first plasma torch 20. Although the only one first plasma torch 20 covers the pads 43 and electrodes 44 in the description of the exemplary embodiment, multiple first plasma torches 20 can be provided. Alternatively, while the gas plasma is applied from the first plasma torch 20 toward the substrate 41 and semiconductor chip 42, the substrate 41 can be displaced to perform a surface treatment on the pads 43 and electrodes 44.

Figure 4:
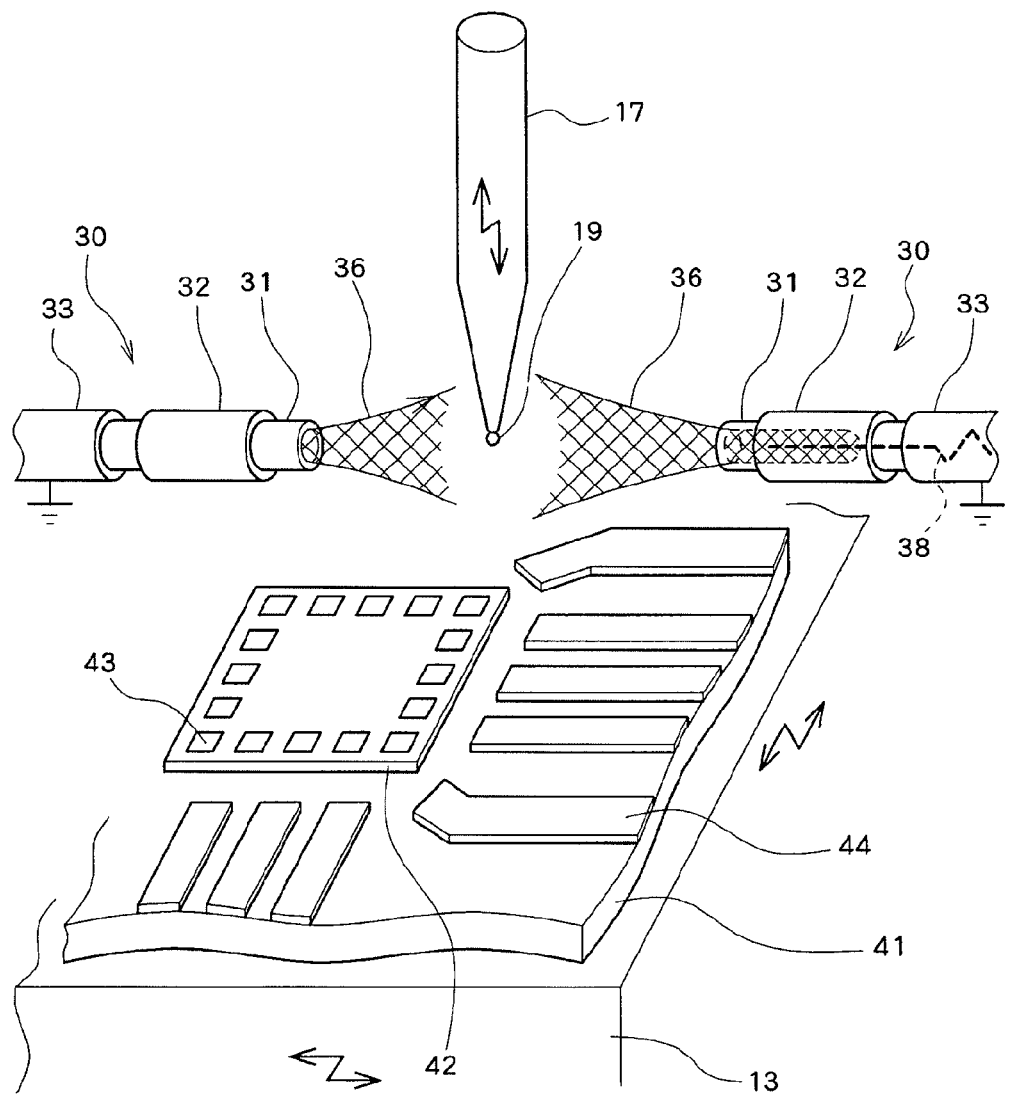
FIG. 4 is a perspective view illustrating a state where a second plasma torch is used to apply gas plasma gas to an initial ball in the bonding apparatus according to an exemplary embodiment of the present invention.

As shown in FIG. 4, the second plasma torches 30 each include, like the first plasma torch 20, a cylindrical tip end portion 31 made of an insulating material and, at the tip end thereof, having an opening through which jet flow 36 of gas plasma blows, a cylindrical external electrode 32 provided outside of the tip end portion 31, a cylindrical gas feed pipe 33 made of an electrically-conductive material and connected to the tip end portion 31, and an internal electrode 38 provided inside of the gas feed pipe 33, one end thereof being in contact with the inner surface of the gas feed pipe 33 and the other end extending inside of the tip end portion 31. The gas feed pipe 33 is connected to the gas supply unit 60 shown in FIG. 3, and the external electrode 32 is connected to the high-frequency power supply unit 70. The gas feed pipe 33 and the internal electrode 38 are electrically grounded. The two second plasma torches 30 are each configured to distribute high-frequency power between the internal electrode 38, grounded gas feed pipe 33, and external electrode 32 to turn gas fed through the gas feed pipe 33 into plasma and to apply the gas plasma from the opening at the tip end portion 31 to the initial ball 19 extending at the tip end of the capillary 17.

Next will be described a step of surface-treating the electrodes 44 on the surface of the substrate 41, pads 43 on the surface of the semiconductor chip 42, initial ball 19, and wire 18 as well as a bonding step using the thus arranged bonding apparatus 10.

As shown in FIG. 2, a substrate 41 is supplied from the supply stack 53 through the inlet slot 51 to the carriage path 14. A semiconductor chip 42 has been mounted on the substrate 41 in the previous process. The control unit 80 introduces the substrate 41 on the carriage path 14 into the chamber 12, which is kept into an inert gas atmosphere and then moves to the cleaning point 27 at which the first plasma torch 20 is installed. After moving the substrate 41 to the cleaning point 27, the control unit 80 performs a first surface treatment step. The control unit 80 supplies gas from the gas supply unit 60 to the first plasma torch 20 as well as supplies high-frequency power from the high-frequency power supply unit 70 to the external electrode 22 to turn gas into plasma in the first plasma torch 20 and, as shown in FIG. 3, to apply the gas plasma to the surfaces of the electrodes 44 on the substrate 41 and the surfaces of the pads 43 on the semiconductor chip 42 to perform a surface treatment on the pads 43 and electrodes 44. In this case, the gas plasma can blow continuously or for every substrate or semiconductor chip. The gas plasma is applied to the surfaces of the pads 43 and electrodes 44 under the inert gas atmosphere in the chamber 12 to clean the surfaces of the pads 43 and electrodes 44 of contamination, water, or foreign material. Since the gas for plasma generation also contains hydrogen serving as reducing gas, oxide films on the surfaces of the pads 43 and electrodes 44 are removed simultaneously. After the application of the gas plasma from the first plasma torch 20 for a predetermined period of time, the control unit 80 completes the first surface treatment step.

After the first surface treatment step, the control unit 80 carries the substrate 41 through the carriage path 14 onto the bonding stage 13 and then vacuums the vacuum contact holes in the bonding stage 13 so that the substrate 41 is brought into contact with and fixed to the bonding surface of the bonding stage 13. The control unit 80 then controls a spark device (not shown) to form the wire 18 extending from the tip end of the capillary 17 into an initial ball 19, and then drives the Z-direction motor in the bonding head 15 to position the formed initial ball 19 so as to be applied with the gas plasma blowing from the second plasma torches 30 within the chamber 12, which maintains the inert gas atmosphere.

Figure 5:
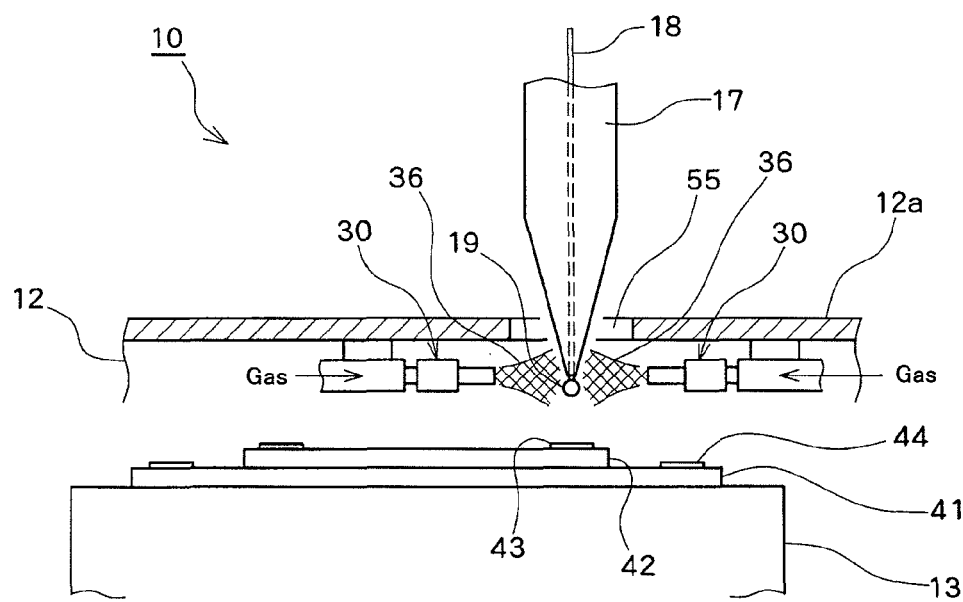
FIG. 5 illustrates a second surface treatment step in the bonding apparatus according to an exemplary embodiment of the present invention.

As shown in FIG. 5, after the adjustment of the height of the initial ball 19, the control unit 80 supplies gas from the gas supply unit 60 to the two second plasma torches 30 as well as supplies high-frequency power from the high-frequency power supply unit 70 to the external electrode 32 to turn the gas into plasma in the second plasma torches 30 and to apply the gas plasma laterally to the initial ball 19 to perform a surface treatment on the initial ball 19. The gas plasma is applied in two opposite directions to (in facing each other across) the surface of the initial ball 19 under the inert gas atmosphere in the chamber 12 to clean the surface of the initial ball 19 of contamination, water, or foreign material. Since the gas for plasma generation also contains hydrogen serving as reducing gas, oxide films formed on the surface of the initial ball 19 when formed by a spark process are removed simultaneously. After the application of the gas plasma from the second plasma torches 30 for a predetermined period of time, the control unit 80 completes the second surface treatment step.

Since the first and second surface treatment steps are both performed in the chamber 12, which maintains the inert gas atmosphere, the surfaces of the pads 43 and electrodes 44 and the surface of the initial ball 19 are kept cleaned after surface-treated by the application of the gas plasma. The metal surfaces are also activated into an easy-to-bond state by the application of the gas plasma.

Figure 6:
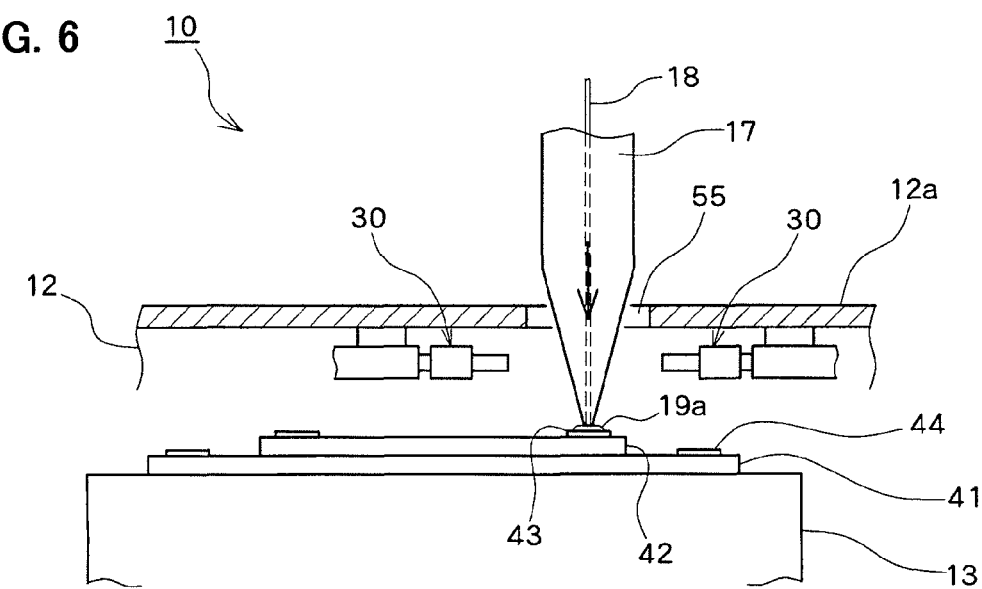
FIG. 6 illustrates a step of bonding to a pad in the bonding apparatus according to an exemplary embodiment of the present invention.

As shown in FIG. 6, after the second surface treatment step, the control unit 80 starts a bonding step. The bonding stage 13, with the bonding surface thereof being in contact the substrate 41 with the semiconductor chip 42 mounted on the surface thereof, moves in the X and Y directions in response to a command from the control unit 80 such that the center of the capillary 17 is aligned over a pad 43, which is targeted for primary bonding. Then, when the pad 43 is aligned with the center of the capillary 17, the control unit 80 stops the movement of the bonding stage 13 in the X and Y directions and drives the Z-direction motor in the bonding head 15 to move the bonding arm 16 downward and thereby to lower the capillary 17 toward the bonding stage 13 so that the initial ball 19 at the tip end of the capillary 17 is pressed against the pad 43. The initial ball 19, when pressed against the pad 43, is deformed to be a compressed ball 19a, providing connection between the wire 18 and the pad 43. This connection is made in the chamber 12, which is kept under the inert gas atmosphere with the surfaces of the pad 43 and initial ball 19 being in a cleaned and activated state, which is able to bond well without using ultrasonic vibration or heating the pad 43. During this bonding step, the application of the gas plasma from the second plasma torches 30 can be continued or stopped.

Figure 7:
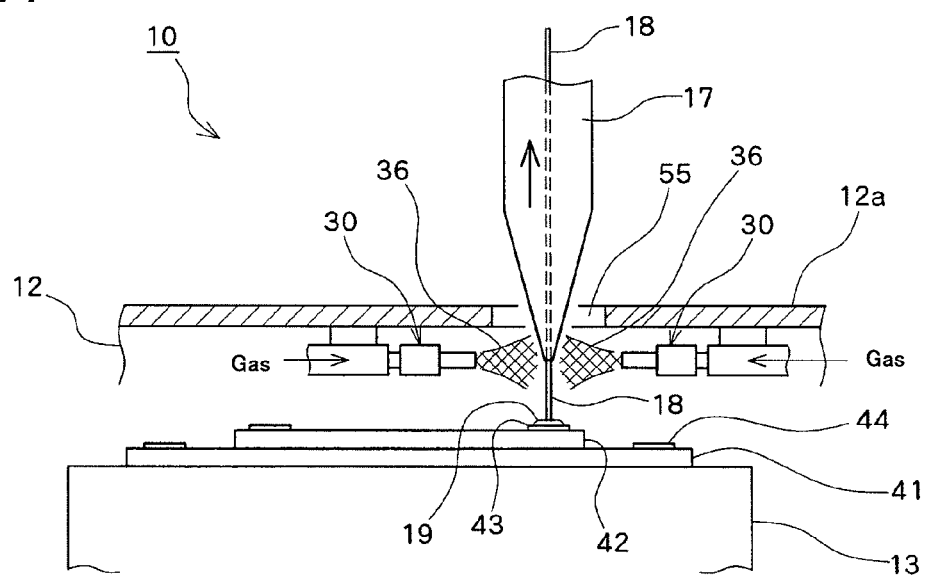
FIG. 7 illustrates payed out wire in the bonding apparatus according to an exemplary embodiment of the present invention.

As shown in FIG. 7, after the bonding of the initial ball 19 to the pad 43, the control unit 80 drives the Z-direction motor in the bonding head 15 to raise the capillary 17 while paying out the wire 18 from the tip end of the capillary 17, such that the wire 18 at the tip end of the capillary is applied with the gas plasma blowing from the second plasma torches 30. The control unit 80 then performs a surface treatment on the payed out wire 18 by the application of the gas plasma from the second plasma torches 30.

Figure 8:
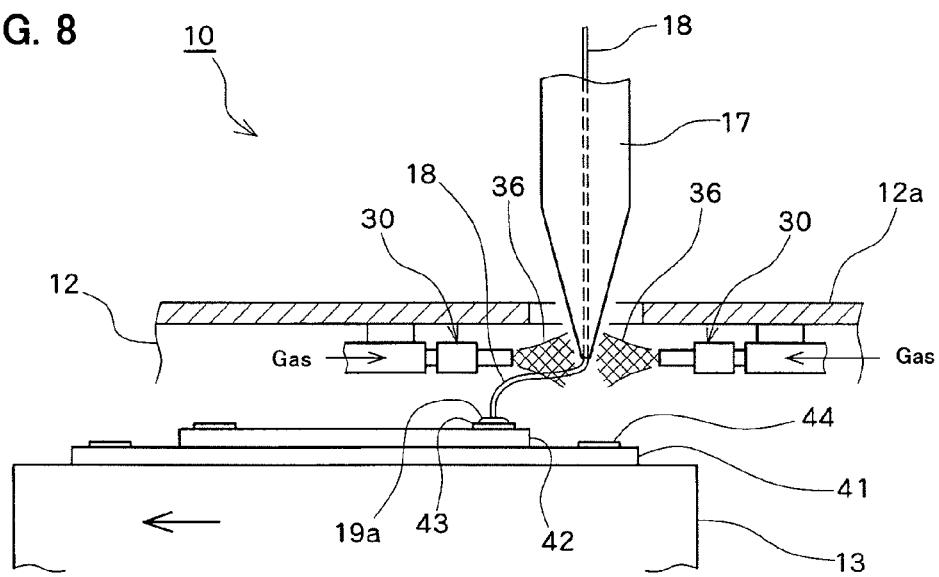
FIG. 8 illustrates wire looping in the bonding apparatus according to an exemplary embodiment of the present invention.

As shown in FIG. 8, after the capillary 17 is raised to a predetermined height, the bonding stage 13 is moved in the X and Y directions while the wire 18 is payed out from the tip end of the capillary 17 to loop the wire 18 such that the center of the capillary 17 is aligned over an electrode 44, which is targeted for secondary bonding. During the looping, although the wire 18 payed out from the tip end of the capillary 17 passes through the gas plasma blowing from the second plasma torches 30, the surface of the payed out wire 18 is cleaned and surface-treated continually.

Figure 9:
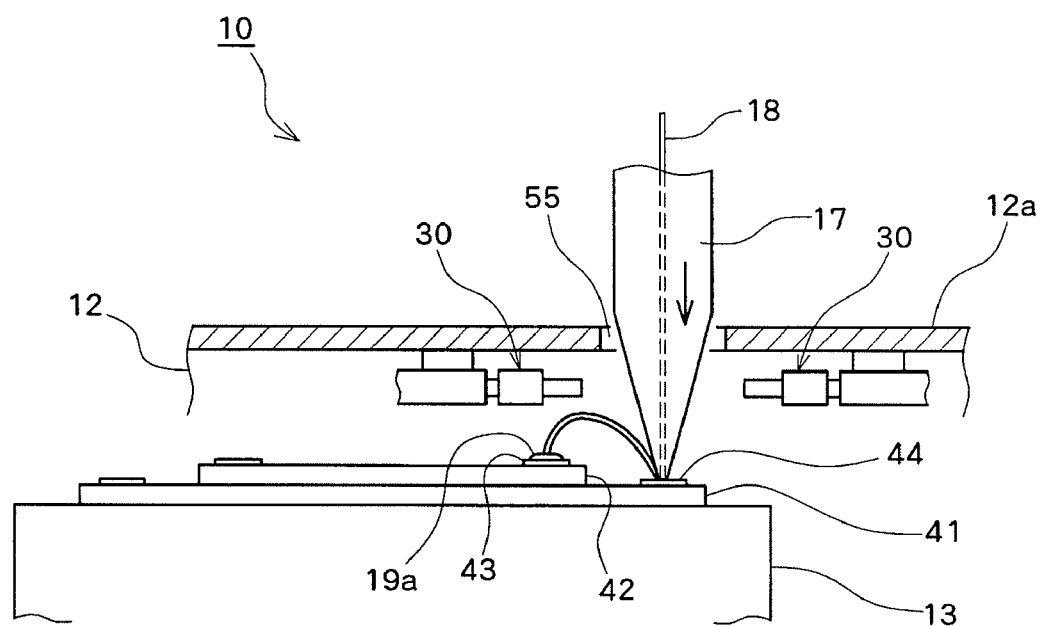
FIG. 9 illustrates a step of bonding to an electrode in the bonding apparatus according to an exemplary embodiment of the present invention.

As shown in FIG. 9, when the center of the capillary 17 is aligned over the electrode 44, which is targeted for secondary bonding, the control unit 80 stops the movement of the bonding stage 13 and drives the Z-direction motor in the bonding head 15 to move the bonding arm 16 downward and thereby to lower the capillary 17 toward the bonding stage 13 so that the wire 18 payed out from the tip end of the capillary 17 is pressed against the electrode 44 to provide connection between the wire 18 and the electrode 44. This connection is made in the chamber 12, which maintains the inert gas atmosphere with the surfaces of both the electrode 44 and wire 18 being in a cleaned and activated state, which is able to bond well without using ultrasonic vibration or heating the electrode 44.

As described above, in the bonding apparatus 10 according to the exemplary embodiment, the pads 43 and electrodes 44 are surface-treated by the first plasma torch 20 in the chamber 12, which maintains the inert gas atmosphere and then moved onto the bonding stage 13 within the chamber 12. The initial ball 19 is also surface-treated in the chamber 12 and then pressed and bonded to the surface-treated pad 43 in the chamber 12, offering the advantage that the surfaces of the pad 43 and initial ball 19 can be bonded while both in a cleaned and activated state, resulting in good bonding. Also, since the mutually bonded surfaces are both in a cleaned and activated state, good bonding can be achieved with no ultrasonic vibration or heating process, offering the advantage that the damage of the semiconductor chip 42 by ultrasonic vibration and/or heating can be reduced.

In the bonding apparatus 10 according to the exemplary embodiment, the wire 18 is looped from the pad 43 on which the initial ball 19 is bonded onto the electrode 44, which is targeted for secondary bonding while surface-treating by the second plasma torches 30, and then the surface-treated wire 18 is pressed and bonded to the surface-treated electrode 44. That is, also when the wire 18 is bonded to the electrode 44, the treated surface of the wire 18 is bonded to the treated surface of the electrode 44, offering the advantage that the surfaces of the electrode 44 and wire 18 can be bonded while both in a cleaned and activated state, resulting in good bonding. Also, since the mutually bonded surfaces are both in a cleaned and activated state, good bonding can be achieved with no ultrasonic vibration or heating process, offering the advantage that the bonding process can be simple.

Further, in the bonding apparatus 10 according to the exemplary embodiment, the gas for plasma generation also contains hydrogen gas serving as reducing gas, offering the advantage that not only contamination, water, or foreign material but also oxide films on the surfaces can be removed simultaneously by the application of the gas plasma.

As has heretofore been described, the bonding apparatus 10 according to the exemplary embodiment offers the advantage that a surface treatment can be performed effectively on bonding targets as well as initial balls 19 and wires 18, whereby good bonding can be achieved.

Figure 10:
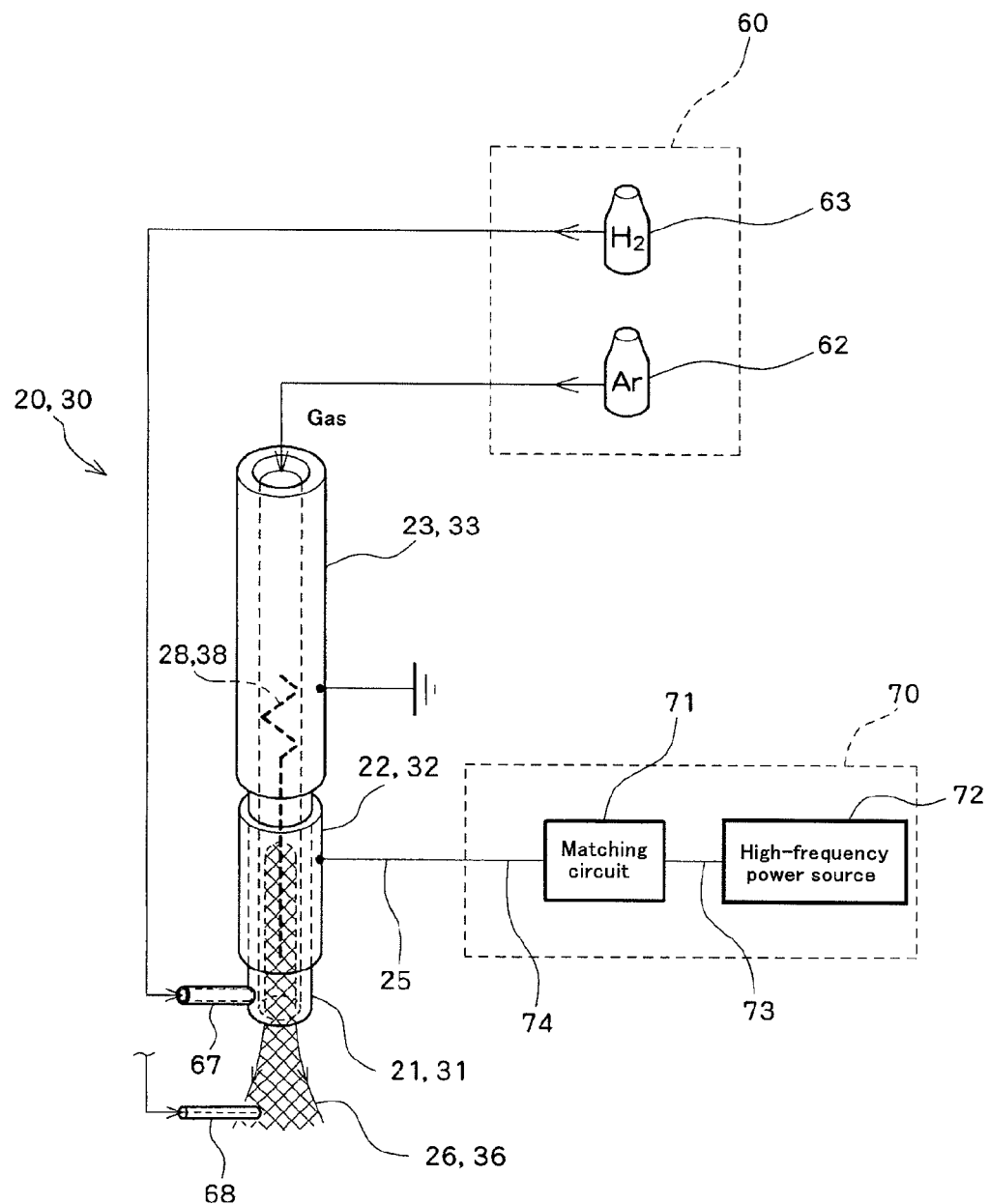
FIG. 10 is a perspective view illustrating the configuration of a plasma torch including a hydrogen mixing nozzle and the application of gas plasma in the bonding apparatus according to an exemplary embodiment of the present invention.

Although the first and second plasma torches 20 and 30 turn a mixture of noble gas and hydrogen gas mixed in the mixing box 61 into plasma and to apply to targets in the description of the exemplary embodiment, hydrogen gas can be mixed into noble gas that is turned into plasma. As shown in FIG. 10, the following arrangement can be employed: noble gas is fed into the gas feed pipes 23 and 33; high-frequency power is distributed between the internal electrodes 28 and 38, gas feed pipes 23 and 33, and external electrodes 22 and 32 to turn noble gas fed through the gas feed pipes 23 and 33 into plasma; and hydrogen gas is mixed into the noble gas, which is turned into plasma, through a hydrogen mixing nozzle 67 provided in the tip end portions 21 and 31 to cause the mixture of the gas, which is turned into plasma and hydrogen gas to blow through the openings at the tip end portions 21 and 31. Alternatively, as shown in FIG. 10, a hydrogen mixing nozzle 68 can be employed that extends into the jet flows 26 and 36 of noble gas, which is turned into plasma, blowing from the openings to mix hydrogen gas into the noble gas, which is turned into plasma.

Although noble gas such as argon is used as plasma source gas in the above-described exemplary embodiment, nitrogen can be used as plasma source gas instead of noble gas.

Although a mixture of hydrogen gas and noble gas is turned into plasma or hydrogen gas is mixed into noble gas, which is turned into plasma, through the hydrogen mixing nozzle 67 or 68 in the description above, oxygen gas can be mixed with or into noble gas instead of hydrogen gas. In the case of mixing oxygen gas, oxygen can be mixed into gas plasma through an oxygen mixing nozzle having a configuration similar to that of the hydrogen mixing nozzles 67 and 68 shown in FIG. 10. Thus mixing oxygen can improve the effectiveness of removing organic contamination on the electrodes 44 on the surface of the substrate 41, pads 43 on the surface of the semiconductor chip 42, initial ball 19, and wire 18 to be surface-treated.

Although the exemplary embodiment describes the case of bonding the wire 18 to the electrodes 44 on the substrate 41, the present invention is also applicable to the case of bonding the wire 18 to leads on a lead frame.

Although the wire 18, when payed out and looped, is surface-treated by the second plasma torches 30 in the description of the exemplary embodiment, the surface treatment on the wire 18 on paying out and looping can be omitted if the surface of the wire 18 is in a cleaned state. In this case, the payed out height of the wire 18 can be smaller than the height where the gas plasma from the second plasma torches 30 flows, whereby the height of the wire loop can be reduced.

The foregoing description of the exemplary embodiment of the present invention has been provided for the purpose of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention from various embodiments and with the various modifications as are suited to the particular use contemplated. It is intended that the scope of the invention be defined by the following claims and their equivalents.

What is claimed is:

1. A bonding apparatus for bonding a wire inserted through a bonding tool to a bonding target, the bonding apparatus comprising:
    a capillary configured as the bonding tool;
    a bonding arm for bonding the wire to the bonding target by means of the capillary, the bonding arm being provided with the capillary at one end thereof;
    a chamber for maintaining an inert gas atmosphere by supplying the inert gas into the chamber, the chamber being mounted on a pedestal and has a box shape covering a bonding stage and a carriage path;
    a first plasma torch for performing a surface treatment of the bonding target that is stopped at a cleaning point, to irradiate gas plasma thereto, the first plasma torch being attached to an upper plate of the chamber over the cleaning point in such a manner as to be substantially perpendicular to the bonding target;
    a second plasma torch for performing a surface treatment of one or both of an initial ball and a wire at a tip end of the capillary that is positioned inside the chamber, to irradiate gas plasma thereto, the second plasma torch being attached to the upper plate of the chamber over the bonding stage in such a manner as to be substantially parallel to the bonding surface of the bonding stage; and
    a bonding unit for bonding surface-treated one or both of the initial ball and the wire on the surface-treated bonding target in the chamber, the bonding unit being configured to comprise a driving mechanism for moving the capillary in an XY-direction along the bonding surface of the bonding target and a Z-direction toward and away from the bonding target.

2. The bonding apparatus according to claim 1, wherein the gas plasma is produced by turning a mixed gas of noble gas and hydrogen into plasma.

3. The bonding apparatus according to claim 1, further comprising a mixing nozzle for mixing hydrogen into plasma of noble gas.

4. A method of bonding a wire inserted through a bonding tool to a bonding target, the method comprising:
   an inert gas filling step of filling an inert gas into a chamber of a bonding apparatus to maintain an inert gas atmosphere therein;
   a first surface treatment step of, after completing the inert gas filling step, performing a surface treatment of the bonding target to irradiate gas plasma to the bonding target that is placed inside the chamber that is maintained under the inert gas atmosphere, by means of a first plasma torch that is attached to an upper portion of the chamber over the bonding target in such a manner as to be substantially perpendicular to the bonding target;
   a second surface treatment step of, after completing the first surface treatment step, performing a surface treatment of one or both of an initial ball and a wire at a tip end of the bonding tool that is positioned inside the chamber to irradiate gas plasma to one or both of the initial ball and the wire by means of a second plasma torch that is attached to an upper portion of the chamber over the bonding stage under the inert gas atmosphere therein in such a manner as to be substantially parallel to the bonding surface of the bonding stage; and
   a bonding step of, immediately after completing the first and second surface treatment steps, bonding surface-treated one or both of the initial ball and the wire to the surface-treated bonding target under the inert gas atmosphere in the chamber in such a manner that the bonding tool is lowered substantially to the surface-treated bonding target.

5. The bonding method according to claim 4, wherein a mixed gas of noble gas and hydrogen is turned into plasma.

6. The bonding method according to claim 4, wherein the first and second surface treatment steps include mixing hydrogen into plasma of noble gas and irradiating the plasma mixed with hydrogen to the bonding target and one or both of the initial ball and the wire.

7. The bonding apparatus according to claim 1, further comprising a control unit for controlling the bonding apparatus, the control unit being configured to comprise:
   an introducing means for introducing the bonding target on the carriage path into the chamber, the chamber being maintained in the inert gas atmosphere, and subsequently moving the bonding target to the cleaning point at which the first plasma torch is installed;
   a first surface treatment means for treating the bonding target under the inert gas atmosphere in the chamber in such a manner that the control unit supplies gas from a gas supply unit to the first plasma torch as well as supplies high-frequency power from a high-frequency power supply unit to the first plasma torch to turn gas into plasma therein and to apply the gas plasma to the bonding target, thereby completing a surface treatment on the bonding target;
   a second surface treatment means for treating the initial ball at the tip end of the capillary under the inert gas atmosphere in the chamber in such a manner that the control unit supplies gas from the gas supply unit to the second plasma torch as well as supplies high-frequency power from the high-frequency power supply unit to the second plasma torch to turn the gas into plasma therein and to apply the gas plasma laterally to the initial ball, thereby completing a surface treatment on the initial ball;
   a first bonding means for, immediately after completing the surface treatment on the bonding target and the initial ball, bonding the surface treated initial ball at the tip end of the capillary to the first bonding point under the inert gas atmosphere in the chamber by causing the capillary to perform a lowering movement in such a manner that the control unit drives the Z-direction driving mechanism to move the bonding arm downward and thereby to lower the capillary to the first bonding point, thereby completing a primary bonding to the first bonding point;
   a wire surface treatment means for treating the wire surface under the inert gas atmosphere in the chamber in such a manner that the control unit drives the Z-direction driving mechanism to raise the capillary until the wire at the tip end of the capillary is applied with the gas plasma while feeding the wire therefrom and subsequently applies the gas plasma to the wire fed out of the tip end of the capillary from the second plasma torch and then the control unit drives the XY-directions driving mechanism to move the bonding stage to loop the wire such that the center of the capillary is aligned over a second bonding point while feeding the wire therefrom and subsequently applies the gas plasma to the wire fed out of the tip end of the capillary from the second plasma torch, thereby completing a wire surface treatment; and
   a second bonding means for, immediately after completing the wire surface treatment, bonding the surface treated wire fed out of the tip end of the capillary to the second bonding point under the inert gas atmosphere in the chamber by causing the capillary to perform a lowering movement in such a manner that the control unit drives the Z-direction driving mechanism to move the bonding arm downward and thereby to lower the capillary to the second bonding point, thereby completing a secondary bonding to the second bonding point.

8. The bonding apparatus according to claim 1, wherein the chamber is configured to comprise:
   an entering side having an inlet slot for entering a bonding target to be supplied from a supply stack to the carriage path inside the chamber;
   an exiting side having an outlet slot for exiting a product from, after completing the bonding, the carriage path inside the chamber to a product stack;
   an upper plate for covering over the bonding stage and a cleaning point on the upstream side of the bonding stage in the carrying direction of the carriage path, the upper plate being provided between the bonding stage and the bonding arm and being provided with a capillary hole through which the capillary attached to the bonding arm passes; and
   an intake for supplying the inert gas into the chamber to maintain the inert gas atmosphere therein.

9. The bonding apparatus according to claim 8, wherein the inlet and outlet slots are provided with a cover respectively to suppress outflow of the inert gas from the chamber.

10. The bonding apparatus according to claim 1, wherein the upper plate of the chamber is configured to comprise a first upper plate and a second upper plate, the first upper plate for covering over the cleaning point and the second upper plate for covering over the bonding stage, the first upper plate being arranged stepwise with respect to the second upper plate.

11. The bonding apparatus according to claim 1, wherein the bonding target is configured to comprise a first bonding point serving as a pad on a semiconductor chip and a second bonding point serving as a lead frame on a substrate.

12. The bonding apparatus according to claim 1, wherein the first plasma torch is configured to comprise:

a tip end portion having an opening through which gas plasma ejects, the tip end portion being placed inside the chamber;

an external electrode for supplying high-frequency power to turn the gas into plasma, the external electrode being connected to the high-frequency power supply unit through an electrical cable running through the upper plate; and a gas feed pipe for feeding gas to turn the gas into plasma, the gas feed pipe that protrudes out of the chamber through the upper plate and is connected to the gas supply unit through a gas pipe connected to the gas feed pipe.

13. The bonding apparatus according to claim 1, wherein the second plasma torch is configured to comprise:

a tip end portion having an opening through which gas plasma ejects, the tip end portion being placed inside the chamber, the tip end portion being attached in such a manner as to extend toward the initial ball formed at the tip end of the capillary;

an external electrode for supplying high-frequency power to turn the gas into plasma, the external electrode being connected to the high-frequency power supply unit through an electrical cable running through the upper plate; and a gas feed pipe for feeding gas to turn the gas into plasma, the gas feed pipe that is bent inside the chamber to protrude out of the chamber through the upper plate and is connected to the gas supply unit through a gas pipe connected to the gas feed pipe.

* * * * *